United States Patent [19]

Pastecki

[11] Patent Number: 4,710,851
[45] Date of Patent: Dec. 1, 1987

[54] COOLING ACCESSORY ATTACHABLE TO AN ELECTRONIC INSTRUMENT

[76] Inventor: Andrew S. Pastecki, 1780 Del Mar Ave., San Marino, Calif. 91108

[21] Appl. No.: 842,425

[22] Filed: Mar. 10, 1986

[51] Int. Cl.⁴ .......................... H02B 1/00; H02K 7/20
[52] U.S. Cl. .................................................. 361/384
[58] Field of Search .............. 361/384, 383; D23/155; D14/114

[56] References Cited

U.S. PATENT DOCUMENTS

D. 276,842  12/1984  Porter ............................ D23/155
D. 285,794   9/1986  Cladek ........................... D14/114
4,383,286    5/1983  Hicks ............................. 361/384

Primary Examiner—Roy N. Envall, Jr.
Attorney, Agent, or Firm—Christie, Parker & Hale

[57] ABSTRACT

Disclosed is a cooling accessory having a housing sized and shaped for seating over the cooling air outlet of an encased electronic instrument or the like and operable to augment the cooling capability of such an instrument. The accessory housing includes a portion in immediate proximity to the instrument carrying handle and a clip is designed to interlock the accessory to the instrument handle and to serve as a carrying handle for both the accessory and the instrument.

17 Claims, 9 Drawing Figures

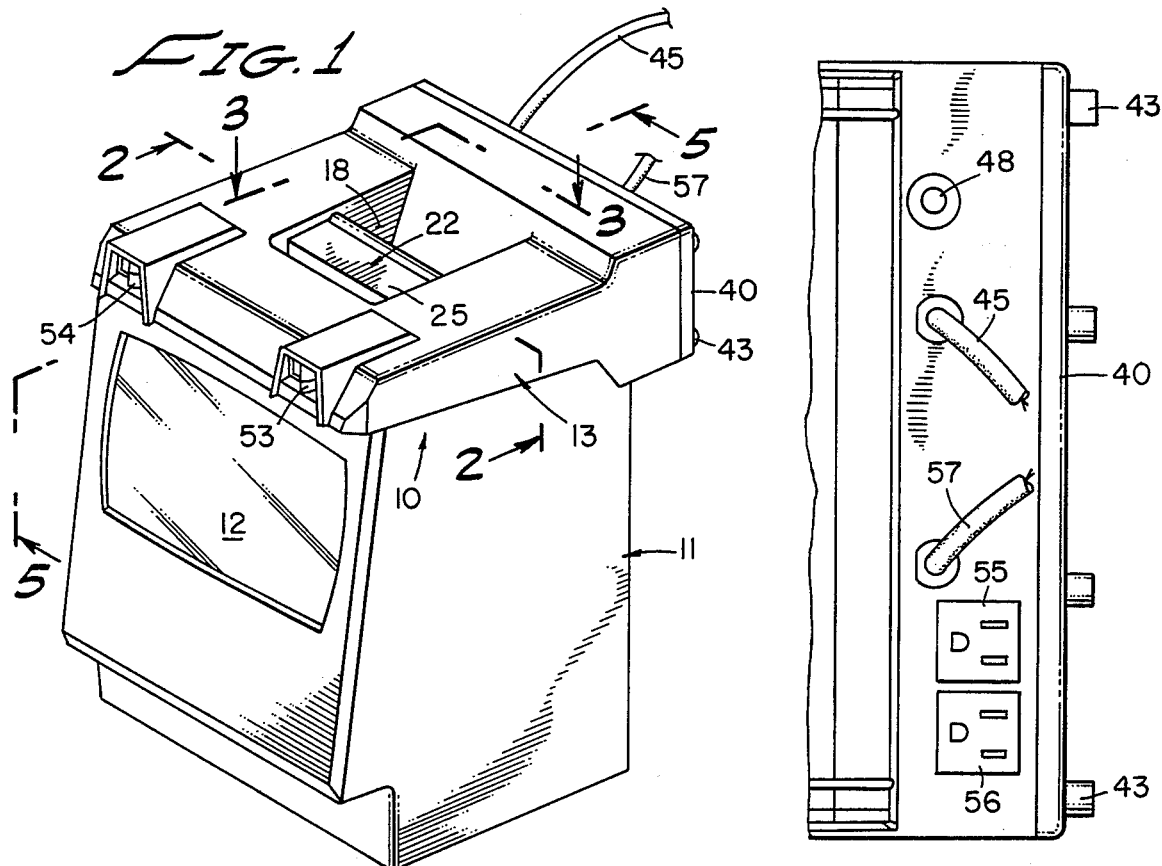
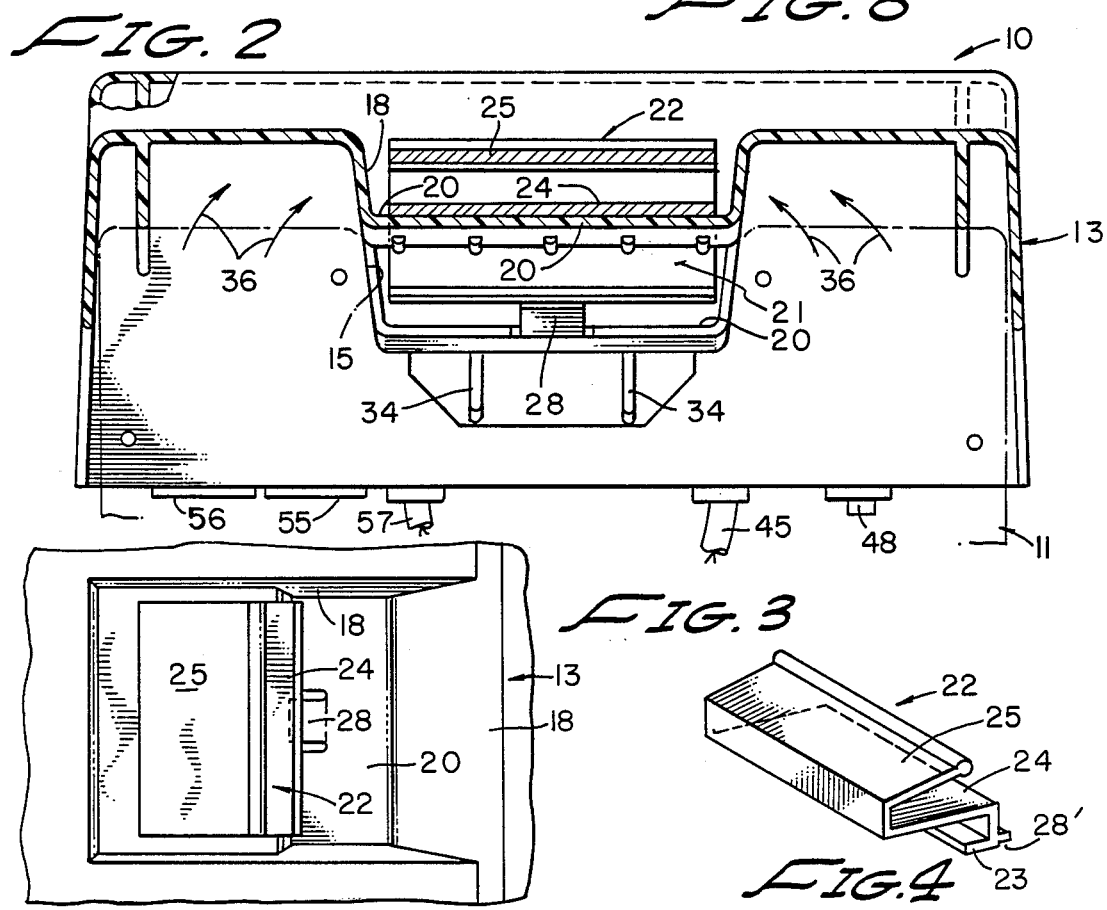

COOLING ACCESSORY ATTACHABLE TO AN ELECTRONIC INSTRUMENT

This invention relates to electronic instruments, and more particularly to a unitary cooling accessory designed to be held assembled in registry with the cooling air outlet of an electronic instrument and to be held rigidly assembled thereto by a clip designed for interlocking engagement with a part of both the instrument and the cooling accessory.

BACKGROUND OF THE INVENTION

Numerous electronic devices not infrequently are subjected to use in operating environments in which the cooling capabilities of the instrument are inadequate and this can cause malfunctioning if not serious injury to the overheated electronic or other components. Either occurrence is intolerable in instrumentation of any kind and this is particularly serious in computer, word processors and in any of many of a wide variety of electronic devices. The device may be designed with adequate cooling capacity for a wide range of normal operating conditions but it is difficult to anticipate many abnormal operating conditions and particularly those in which the equipment is subject to abnormal ambient temperature conditions.

In recognition of these problems various proposals have been made heretofore for auxiliary equipment designed to supplement the manufacturer's standard product. Such auxiliaries commonly and typically require modification of the existing equipment to accommodate attachment of the auxiliary. Not only is this likely to result in injury to the original equipment or alteration of the ost instrument but it also requires special tools and the skill and expense of a skilled technician. Examples of prior supplemental cooling accessories are found in the Koltuniak et al U.S. Pat. No. 3,396,780; Lee U.S. Pat. No. 4,027,206; Kirchner U.S. Pat. No. 4,084,213; Hicks U.S. Pat. No. 4,383,286; Hicks U.S. Pat. Design No. 268,283 and Rapp U.S. Pat. Design No. 275,787. Koltuniak et al proposes an artificially cooled heat exchange coil located in a housing attachable to a rectifier unit. Lee proposes providing an electronic chassis with a heat sink subassembly and Kirchner discloses a computer having an air cooler enclosed in his folding computer display screen. Rapp and the two Hicks patents are the only ones proposing a unitary cooling accessory mountable upon the exterior of a computer but each of these accessories require alteration of the computer housing and are subject to the objections and disadvantages pointed out above.

SUMMARY OF THE INVENTION

The present invention provides a simply constructed inexpensive self-contained cooling accessory avoiding the shortcomings and disadvantages of prior supplemental cooling devices. The exemplary embodiment herein disclosed has a one-piece housing shaped to internest with the exterior surfaces of the instrument to be cooled and having a clip designed to lock the cooling accessory firmly and immovably to the instrument without need for alterations tools or fasteners. Desirably, the clip includes a handgrip which serves additionally as a carrying handle for the instrument and its attached supplemental cooling accessory. Housed within the accessory is a motor driven fan, a manually resetable circuit breaker, a substitute service cord for the main instrument and a short service cord and control switch for controlling the power supplying to both the fan and to the instrument being cooled. The control circuitry for the cooling accessory includes a surge suppressor.

Accordingly, it is a primary object of this invention to provide a unique and improved cooling accessory readily attachable to an existing electrical instrument without need for alterations to the existing equipment and without need for tools or tool operated fasteners.

Another object of the invention is to provide an auxiliary cooling accessory shaped and designed for internesting assembly with the exterior casing of an existing electronic instrument and to be held securely assembled thereto by a spring clip.

Another object of the invention is to provide a cooling accessory adapted to be securely assembled over the air outlet and carrying handle of an electronic instrument by a single clip incorporating a substitute carrying handle for both the instrument and the accessory.

These and other more specific objects will appear upon reading the following specification and claims and upon considering in connection therewith the attached drawing to which they relate.

Referring now to the drawing in which a preferred embodiment of the invention is illustrated:

FIG. 1 is a perspective view of a typical electronic instrument in the form of a computer having an exemplar of the present invention clipped thereto;

FIG. 2 is a cross secitonal view through the cooling accessory taken along line 2—2 on FIG. 1;

FIG. 3 is a fragmentary top plan view of the cooling accessory in the area indicated by arrows 3—3 on FIG. 1;

FIG. 4 is a perspective view of the clip serving to hold the cooling accessory rigidly assembled to the electronic instrument;

FIG. 8 is a bottom plan view of the fan chamber taken along line 8—8 on FIG. 5.

Figure 5:
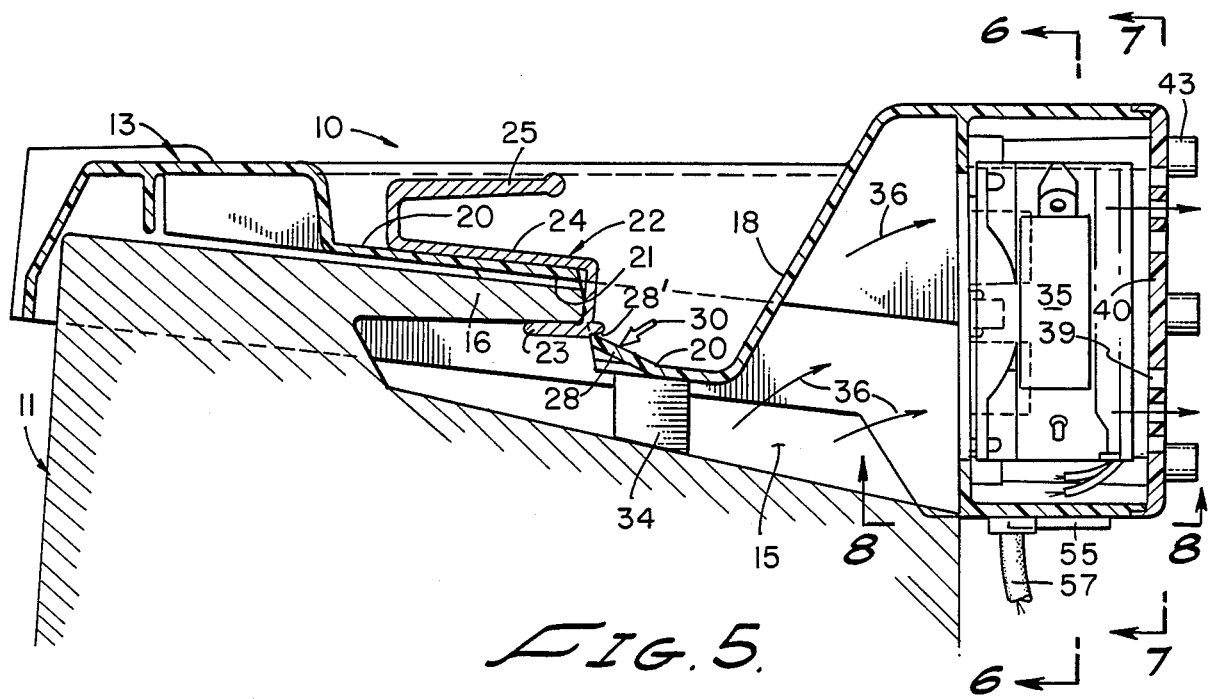
FIG. 5 is a cross sectional view taken along line 5—5 on FIG. 1.

Referring more particularly to FIG. 1, there is shown an exemplar of the invention cooling accessory, designated generally 10, snugly assembled across the top of an electronic instrument here shown as comprising a computer 11 having a display panel 12 in its front wall. Accessory 10 has a one piece main housing 13 of generally inverted cup shape, the sidewalls of which telescope over and fit snugly about the top rim of the instrument 11. The top of instrument 11 has a steep walled recess or well 15, (FIG. 2, FIG. 5) equipped with a cantilever handgrip or carrying handle 16 best shown in FIG. 5. The accessory housing 13 has a complimentary shaped well or recess 18 portions of which are sized to internest snugly into the juxtaposed sidewalls of well 15 of the instrument. As is best shown in FIG. 5, wall portion 20 of the recess 18 embraces and lies flush against adjacent portions of the instrument carrying handle 16.

The portion of wall 20 across the free end of handgrip 16 is provided with an opening 21 to accommodate an S-shaped clip 22 serving to hold the cooling accessory 10 rigidly assembled to instrument 11. The details of clip 22 are best shown in FIG. 4, wherein the lowermost leg 23 of the clip has a pressed frictional fit against the bottom of the instrument carrying handle 16, its intermediate leg 24 has a corresponding frictional fit against the bottom wall 20 of the accessory casing and the uppermost clip leg 25 serves all of the functions of handgrip 16 in addition to forming an integral part of the clip holding accessory 10 assembled to instrument 11.

Desirably, clip 22 is locked in its assembled position by a resilient tang or tongue 28 forming a part of the bottom wall 20 of recess 18. The lefthand end or free end of tongue 28 is positioned to engage the right hand lower corner 28' of clip 22 to lock the clip in its assembled position. If there should be need for disassembly of the cooling accessory, this is readily accomplished by applying downward pressure on tongue 28 as is indicated by arrow 30 while at the same time shifting the clip 22 bodily to the right as viewed in FIG. 5. The bottom wall 20 also preferably includes one or more underlying struts 34 (FIG. 5) designed to rest against the bottom wall of the instrument well 15 and cooperating with the sidewalls of housing 13 to hold this housing snugly telescoped against the top surface of the instrument 11.

Figure 6:
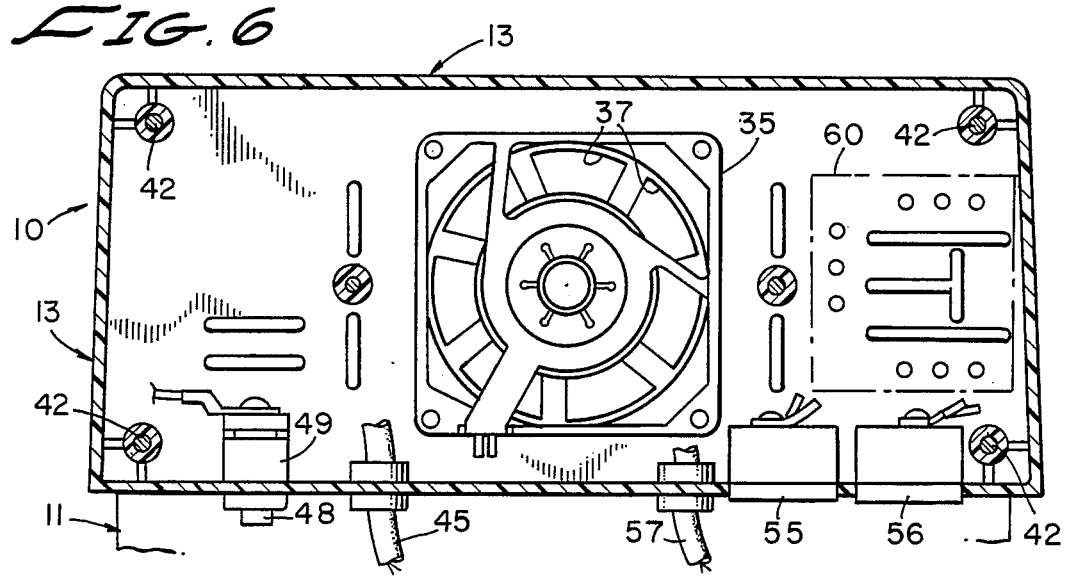
FIG. 6 is a cross sectional view taken generally along line 6—6 on FIG. 5.
Figure 7:
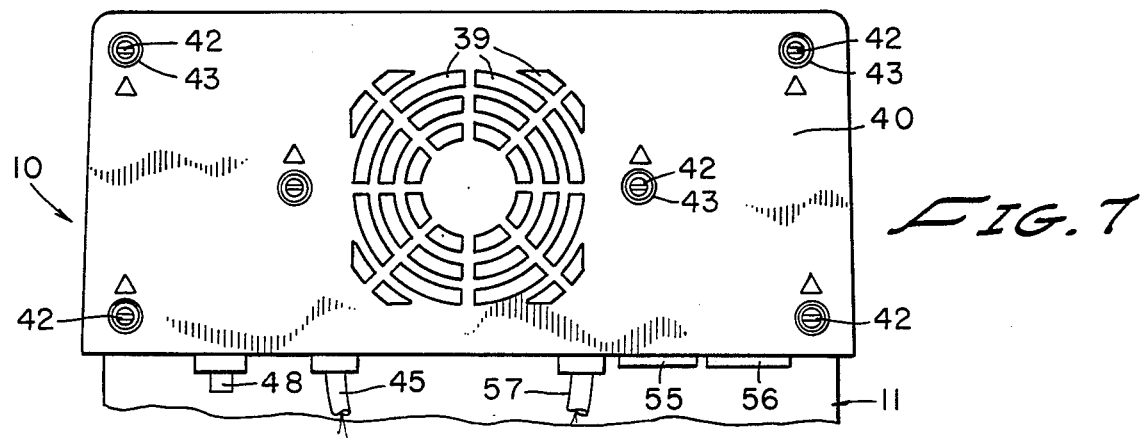
FIG. 7 is an elevational view taken along line 7—7 on FIG. 5 and showing details of the fan chamber access cover.

Referring now more particularly to FIGS. 1, 5 and 6, it will be noted that a portion of the accessory housing 13 overhangs and extends downwardly along one sidewall of instrument 11 and serves to house the cooling fan 35 as well as electrical accessories of the power supply. The motor of fan 35 draws cooling air upwardly through the interior of instrument 11 and through openings in its top to either side of well 15 as is indicated by the arrows 36 in FIG. 2. This air is ejected by the fan through the openings 37 (FIG. 6) and exhausted from the accessory through openings 39 (FIG. 7) in the fan chamber cover 40. This cover is held detachably assembled to casing 13 by capscrews 42 having their heads surrounded by tubular bosses 43 projecting sufficiently outwardly from the outer face of the cover to safeguard against interference with the free flow of cooling air from the grill openings 39 if the accessory cover 40 is positioned close to another object.

Referring to FIGS. 1, 6 and 8, there are shown fittings and accessories of the power supply and for its control for all components including the cooling fan 35, computer 11 and any auxiliary such as a printer for the computer. A main three wire power service cord 45 is plugged into a source of 115 VAC power thereby supplying power to a suitable terminal board such as that indicated by the dot and dash lines 60 in FIG. 6. This board is connected in circuit with the accessory components illustrated in the schematic shown in FIG. 9. These components include a circuit breaker 49 having a reset button 48, the main power on/off switch 53, three metal oxide varistors VR1, VR2 and VR3, fan motor 35, an EMI filter 61 and an on/off switch 54 to control the power to instrument 11 via the service cord 57. This service cord is relatively short and its outlet plug is insertable into the power supply fitting of instrument 11. Suitable identical varistors are obtainable from General Electric and are obtainable as GE-V130LA20A and the EMI filter is obtainable from SAE Power Devices, Model GA3A18. Additionally, the schematic includes two power outlet fittings 56, 55 for connection to suitable computer auxiliaries of the main instrument 11 such as a printer, a modem, etc.

The mode of attaching and utilizing the cooling accessory 10 will be quite apparent from the foregoing description. The user simply telescopes the accessory 10 over the handgrip 16 of instrument 11 until the rim edges of its housing 13 are firmly seated. Thereafter, clip 22 is snapped into its fully seated position as shown in FIG. 5 with tongue 28 in place to lock the clip against disassembly. The electrical instrument service cord 57 is then plugged into the power source fitting of the computer 11 and service cord 45 of the cooling accessory 10 is connected to a 115 VAC power source. The equipment is now in readiness for use as soon as the power switch 53 (FIG. 1) is closed thereby supplying power to the auxiliary cooling fan 35, the computer and to the control switch 54 connected to the service outlet 55, 56 which are then available to supply power and operating signals to a computer auxiliary, not shown, such as a printer. The fan then operates to draw a stream of cooling air through the interior of instrument 11 and outwardly to exhaust air outlets indicated by the arrows 36 in FIGS. 2 and 5, thence through the fan and exhaust through grill 39. Should the circuit breaker 49 open to protect the equipment against overload, the operator simply resets the circuit breaker by depressing its reset button 48.

Figure 9:
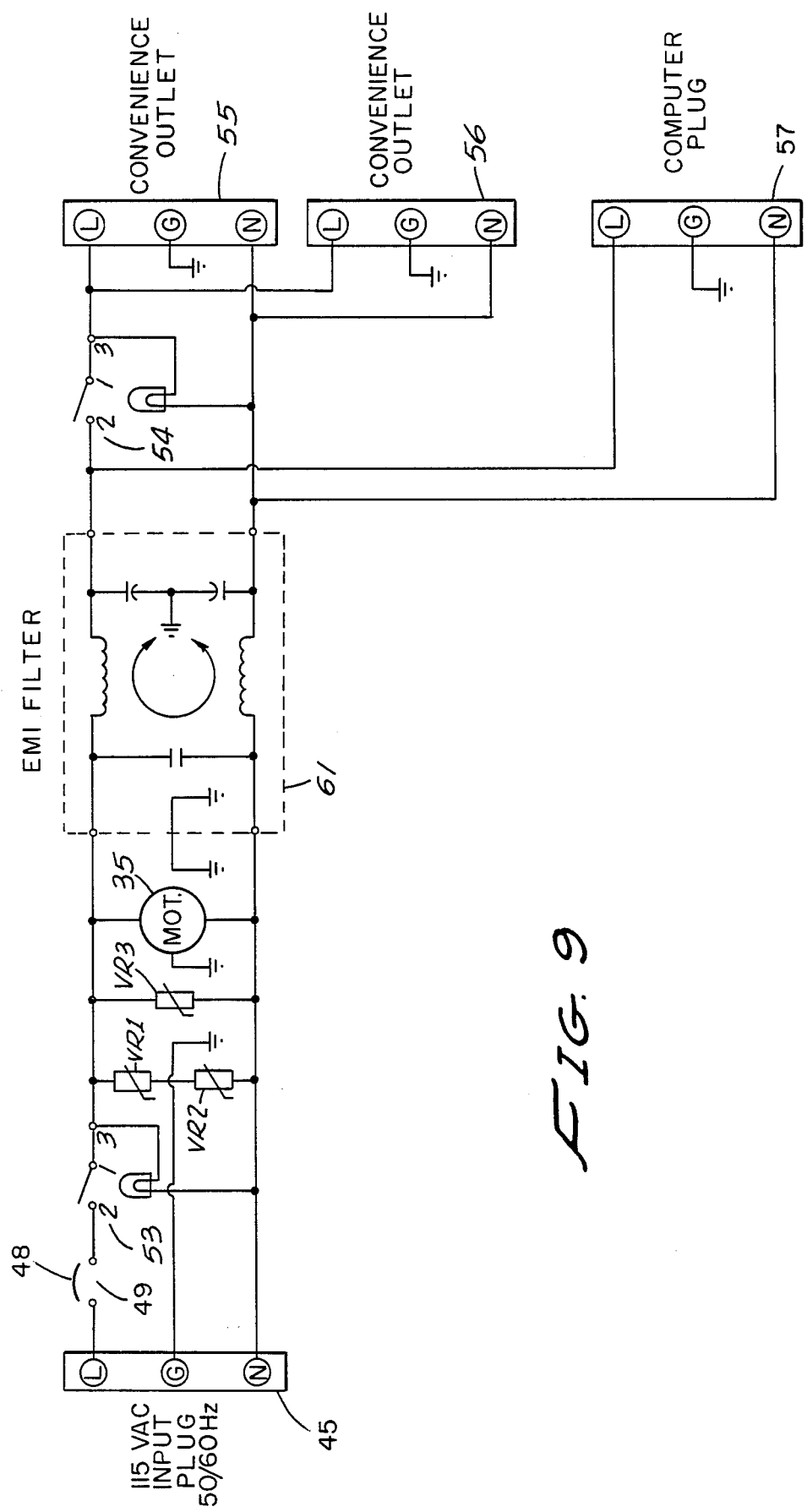
FIG. 9 is a schematic of the cooling accessory.

FIG. 9 shows a schematic of the cooling accessory which includes a surge suppressor 60 to protect the computer components as well as those of any auxiliaries connected to the power outlets 55 and 56. The surge suppressor components include three similar metal oxide varistors VR1, VR2 and VR3 suitable ones of which are obtainable from General Electric identified as GE-V130LA20A and an EMI filter 61 obtainable from SAE Power Devices, Model GA3A10.

If the user should have need for detaching accessory 10 for servicing or other purpose, he merely depresses the locking tongue 28 and withdraws the locking clip 22. This releases accessory 10 which is then lifted away from instrument 11.

While the particular cooling accessory attachable to an electronic instrument herein shown and disclosed in detail is fully capable of attaining the objects and providing the advantages hereinbefore stated, it is to be understood that it is merely illustrative of the presently preferred embodiment of the invention and that no limitations are intended to the detail of construction or design herein shown other than as defined in the appended claims.

I claim:

1. A cooling accessory adapted to be clipped to encased electronic equipment to facilitate cooling of components of said electronic equipment, said accessory comprising:

a housing enclosing power-driven fan means between air inlet and outlet openings of said housing;

said housing being shaped for mounting against the exterior of encased electronic equipment with said air inlet in communication with an air outlet of said electronic equipment; and clip means constructed and arranged for assembly astride continuous portions of said housing and said encased electronic equipment to hold said cooling accessory firmly in place against the exterior surface of said encased electronic equipment;

wherein said housing has a depression in the wall thereof shaped and adapted for assembly in juxtaposition to a handle of said encased electronic equipment; and wherein said clip means is constructed for assembly astride said handle and juxtaposed portions of said cooling accessory housing.

2. A cooling accessory as defined in claim 1 characterized in the provision of a power service cord extending outwardly from said housing and connectible to a power control switch controlling power to said power-driven fan means and to power service cord connectible to said encased electronic equipment.

3. A cooling accessory as defined in claim 1 characterized in that said accessory inclues means projecting outwardly therefrom adjacent said air outlet opening to safeguard against blockage of air flow therefrom.

4. A cooling accessory as defined in claim 1 characterized in that said clip means includes a handgrip portion on the exterior of said housing with portions spaced outwardly therefrom and adapted to be grasped by a user's hand while moving said assembled cooling accessory and electronic instrument from place to place as a unit.

5. A cooling accessory as defined in claim 4 characterized in that said housing includes detent means operable to hold said clip means in assembled position astride said handle and the juxtaposed portion of said cooling accessory housing.

6. A cooling accessory as defined in claim 5 characterized in that said detent means is integral with said housing in an area adjacent said clip means when in the assembled position thereof.

7. A cooling accessory as defined in claim 4 characterized in that said clip means is S-shaped with the lowermost two legs thereof adapted for snug telescopic assembly astride said handle and to the portion of said housing immediately overlying the exterior of said handle; and the upper leg of said clip being spaced sufficiently outwardly from said handle to provide a handgrip for said accessory and for electronic equipment clipped thereto.

8. A unitary auxiliary cooling accessory adapted to be held rigidly assembled to an encased computer having a handle equipped recess in the wall thereof and an air outlet thereadjacent, said accessory comprising:
 a housing shaped and sized to have a snug fit against the top of said computer and having an air inlet positioned to register with said computer air outlet;
 the top wall of said housing having a depression shaped for internested assembly with said handle-equipped recess of said computer;
 an S-shaped clip sized for assembly astride said handle and the adjacent wall of said housing with one leg of said clip located exteriorly of said housing and spaced sufficiently therefrom to serve as a carrying handle for said computer when assembled thereto; and
 fan means in said housing operable to enhance the flow of cooling air through the computer and outwardly from an air outlet of said housing.

9. A cooling accessory as defined in claim 8 characterized in that said housing is generally an inverted L-shape with the longer leg thereof shaped for telescopic assembly against the top of said computer and a shorter leg extending downwardly along one sidewall of said computer and sized to house said fan means.

10. A cooling accessory as defined in claim 9 characterized in that said shorter leg is provided with electrical accessories including a first electrical service cord adapted to be connected to an electrical outlet, and a short second service cord adapted to plug into a power supply receptacle of said computer, and a power control switch for control of the supply of power to said fan means and to said computer mounted on said cooling accessory on the long leg of said cooling accessory remote from said fan means.

11. A cooling accessory as defined in claim 10 characterized in that said electrical accessories include a power control switch for controlling the supply of power and operating signals to a computer auxiliary.

12. A cooling accessory as defined in claim 8 characterized in that the housing is molded in two pieces of plastic material including a main body having an open-sided chamber for said fan means and a cover for said open-ended chamber formed with air outlet openings.

13. A cooling accessory as defined in claim 12 characterized in that the main body of said housing includes integral resilient detent means positioned to lock said clip means against disassembly from said computer handle and forcibly deflectable to permit disassembly of said clip means from the assembled position thereof.

14. A cooling accessory as defined in claim 12 characterized in that said cover forms the major portion of the outer wall of said short leg of said housing and includes means projecting outwardly therefrom to prevent blockage of air flow out of said air outlet opening.

15. A cooling accessory as defined in claim 8 characterized in that the air inlet of said housing includes a shouldered flange, shaped and sized to telescope over and seat against the upper rim edge of said encased computer.

16. A cooling accessory adapted to be clipped to encased electronic equipment to facilitate cooling of components of said electronic equipment, said accessory comprising:
 a housing enclosing power-driven fan means between air inlet and outlet openings of said housing;
 said housing being shaped for mounting against the exterior of encased electronic equipment with said air inlet in communication with an air outlet of said electronic eqipment;
 clip means constructed and arranged for assembly astride continuous portions of said housing and said encased electronic equipment to hold said cooling accessory firmly in place against the exterior surface of said encased electronic equipment;
 a power service cord extending outwardly from said housing and connectible to a poweer control switch controlling power to said power-driven fan means and to a power service cord connectible to said encased electronic equipment; and
 surge suppression means connected in circuit with the power supply to said encased electronic equipment.

17. A cooling accessory as defined in claim 16 characterized in the provision of resettable circuit breaker means in circuit with the power supply to said air circulating fan.

* * * * *